United States Patent [19]

Conradi

[11] 3,898,686

[45] Aug. 5, 1975

[54] SEMICONDUCTOR RADIATION DETECTOR

[75] Inventor: Jan Conradi, Dollard des Ormeaux, Canada

[73] Assignee: RCA Limited, Bellevue, Canada

[22] Filed: Mar. 11, 1974

[21] Appl. No.: 449,999

[52] U.S. Cl. .................................... 357/30; 357/58

[51] Int. Cl² ................ H01L 27/14; H01L 31/00; H01L 29/12

[58] Field of Search ................................ 357/30, 58

[56] References Cited

UNITED STATES PATENTS

| | | | |
|---|---|---|---|
| 3,249,764 | 5/1966 | Holonyak | 307/88.5 |
| 3,284,639 | 11/1966 | Guiliano | 307/88.5 |
| 3,324,297 | 6/1967 | Stieltyes | 250/211 |
| 3,532,945 | 10/1970 | Weckler | 317/235 |
| 3,810,049 | 5/1974 | Kraus | 331/81 |

*Primary Examiner*—Martin H. Edlow
*Attorney, Agent, or Firm*—G. H. Bruestle; D. S. Cohen; D. N. Calder

[57] ABSTRACT

A semiconductor unijunction device including a body of intrinsic semiconductor material having a pair of opposed surfaces. At one surface is a pair of spaced regions of opposite conductivity. At the opposite surface is a third region of either conductivity type. By controlling, in the intrinsic body, the curvature of the lines of equipotential of the electric field, a relationship of the current flowing into two of the semiconductor's conductivity regions will indicate the wavelength of radiation falling on the device.

14 Claims, 6 Drawing Figures

SEMICONDUCTOR RADIATION DETECTOR

BACKGROUND

The present invention relates to a semiconductor radiation detector and more specifically to a semiconductor radiation detector with spectrometric capabilities.

In the field of radiation detectors, a problem has been to prevent background radiation such as the sun or interior lighting from interfering with the operation of the detector. What is needed is a device that can be used in the presence of background radiation and provide information about the wavelength of the radiation being detected.

SUMMARY OF THE INVENTION

A radiation detector including a body of intrinsic semiconductor material having a pair of opposed surfaces. Two spaced regions of opposite conductivity are in the intrinsic body at one surface. A third region of either conductivity type is at the opposite surface of the body.

DETAILED DESCRIPTION

Figure 1:
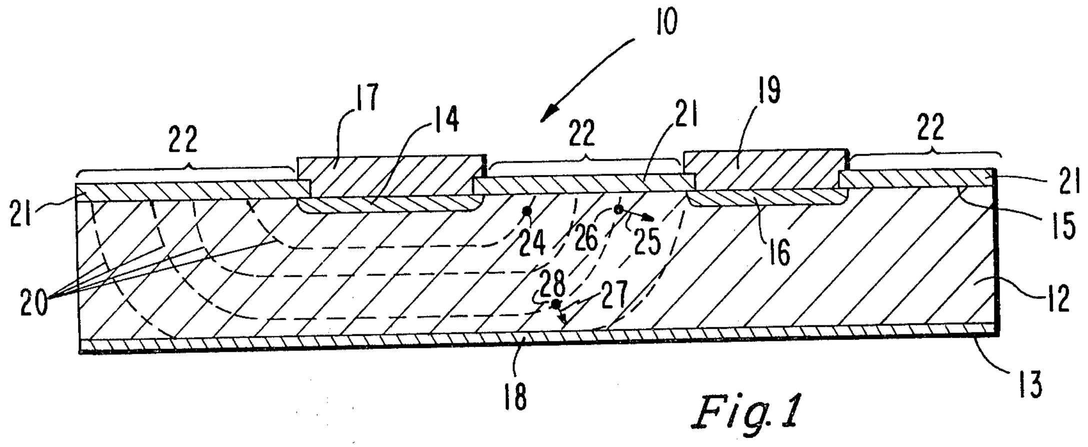
FIG. 1 is a cross-sectional view of a form of the radiation detector of the present invention showing the arrangement of the electrical field's lines of equipotential.

Referring to FIG. 1, an embodiment of the semiconductor radiation detector of the present invention is designated as 10.

The semiconductor radiation detector 10 includes a body 12 of intrinsic semiconductor material having a pair of opposed surfaces 13 and 15. A pair of spaced regions 14 and 16 of opposite conductivity type are in the body 12, at the surface 15. A third region 18 of the same conductivity type as region 16 is in the body 12 at the opposite surface 13. Thus, if regions 16 and 18 are of a P type conductivity, then region 14 would be of an N type conductivity and intrinsic semiconductor region 12 would be of a $\pi$ type conductivity. Alternatively, if regions 16 and 18 are of an N type conductivity, then region 14 would be of a P type conductivity and intrinsic semiconductor body 12 would be of a $\nu$ type conductivity.

An oxide layer 21 is on the surface 15 of intrinsic semiconductor body 12. Oxide layer 21, typically of silicon dioxide, functions as a current passivation layer, and can be either thermally grown or is a deposited layer.

Extending over region 14 is contact 17, and extending over region 16 is contact 19. Contacts 17 and 19 are of a metallic material with good electrical conductivity and highly reflective so that they will reflect light incident on them. The contacts 17 and 19 do not cover the entrant surfaces 22, which are the areas through which light enters into intrinsic material 12.

In the use of semiconductor radiation detector 10 by connecting contact 17 to the positive terminal of a voltage source, if region 14 is of N conductivity, and connecting contact 19 to the negative terminal of a voltage source, if region 16 is of p conductivity, the detector 10 is reverse biased. Reverse biasing creates a depletion region which can extend throughout the intrinsic body 12. Region 18 is also biased, in order to draw current, and generally has the same potential as at the region 16. The electric field generated in the intrinsic region 12, due to the reversed biasing, is illustrated by lines of equipotential, designated as 20.

The semiconductor radiation detector 10 has a second biasing mode in which regions 14 and 16 are reverse biased but region 18 is at a different potential than region 16. This second biasing mode will change the spectral sensitivity of the detector 10.

Light falling on radiation detector 10 can only enter the depletion region in the areas designated as 22, since metallic contacts 17 and 19 reflect light. As is well known in the art, light that is absorbed in a semiconductor material will generate electron-hole pairs. As is also well known in the art, short wavelength radiation is absorbed and generates electron-hole pairs in a semiconductor closer to the entrant surface than long wavelength radiation which generates electron-hole pairs farther from the entrant surface. Thus, radiation absorbed in the depletion region will generate electron-hole pairs at some distance from the entrant surface depending on the wavelength of the radiation. However, once the electrons and holes are generated, the direction they will drift is dependent on the configuration of the electric field lines of equipotential 20. Photogenerated holes and electrons move in a direction normal to the lines of equipotential 20, because the direction of the electrical force is perpendicular to the equipotential lines.

With radiation detector 10 reverse biased, and regions 16 and 18 of P type conductivity, and region 14 of N type conductivity, a photogenerated electron 24 generated by short wavelength radiation will drift to region 14. The corresponding photogenerated hole 26, which has an attraction to either P type region, will drift toward region 16 because the equipotential lines 20, near entrant surfaces 22, have a substantial component of electrical force 25 parallel to entrant surfaces 22 and this force causes the holes to drift toward region 16. Alternatively, a photogenerated hole 28, generated by long wavelength radiation will drift toward P type region 18, because the equipotential lines 20 curve near region 18 causing a substantial component of electrical force 27 to pull the hole toward region 18. For radiation absorbed far from entrant surfaces 22, corresponding to long wavelength radiation, the photogenerated electrons will again drift to the N type region 14. Therefore, the ratio of the current at region 16, (hereinafter referred to as I*u*) to the current at region 18 (hereinafter referred to as I*o*) both of which are the result of the photogenerated carriers, will bear a relationship to the wavelength of the light incident on radiation detector 10. The ability of radiation detector 10 to identify the wavelength of radiation incident upon it, demonstrates detector 10's spectrometric capability. In addition, radiation detector 10 distinguishes between short and long wavelength radiation incident on it. By comparing the output currents of the two like conductivity regions 16 and 18, a differentiation between short and long wavelength radiation is made; thus, radiation detector 10 can be used in the presence of background radiation.

Figure 2:
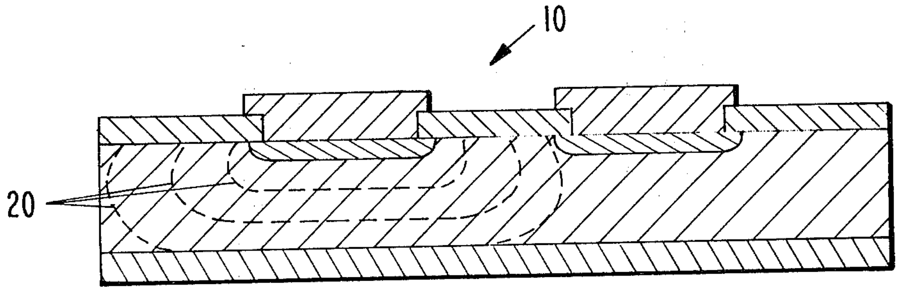
FIG. 2 is a cross-sectional view of the device of FIG. 1 illustrating the arrangement of the electrical field's lines of equipotential when the reverse bias voltage is increased.

The ratio of the current through region 16 to the current through region 18 (I*u*/I*o*) is dependent on the curvature of the electric field's lines of equipotential 20 in the area under entrant surfaces 22. Electrical force is perpendicular to the lines of equipotential 20 and the more curved these lines are toward region 16, the larger the component of electrical force in the direction of region 16 and therefore, a larger current through region 16 will result. Lines of equipotential with increased curvature are the result of increasing the reverse electrical bias on detector 10. The resulting increase in curvature caused by increasing detector 10 reverse biasing voltage is illustrated in FIG. 2. Conversely, lowering the reverse biasing voltage will decrease the curvature of the lines of equipotential and increase the current in region 18 as a result of an increase in the electrical force component toward region 18.

Even though the curvature of lines of equipotential 20 may be varied, the variation only changes the ratio of the currents I*u* to I*o* for radiation of a specific wavelength. Therefore, the varying of the curvature of lines 20 changes the radiation detector's spectral response.

Figure 3:
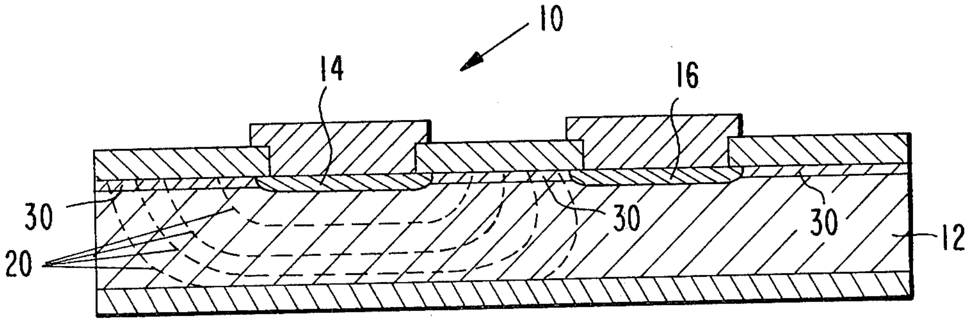
FIG. 3 is a cross-sectional view of the device of FIG. 1 illustrating the arrangement of the lines of equipotential when the surface of the intrinsic region is of the same conductivity type but of a higher carrier concentration than the remaining portion of the intrinsic region.
Figure 4:
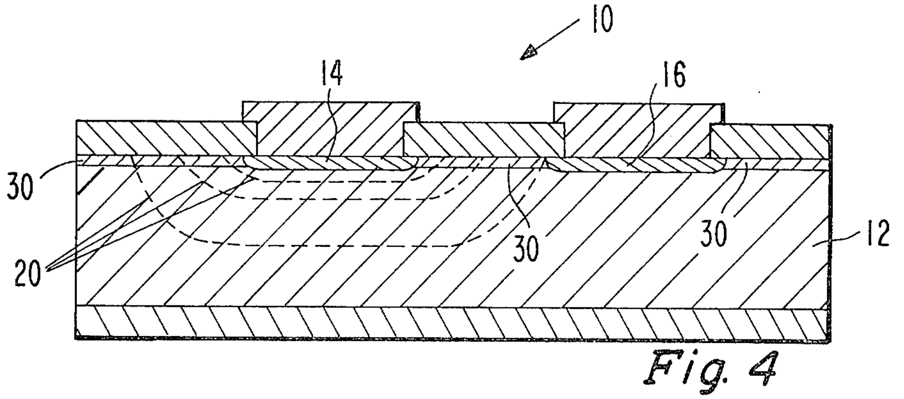
FIG. 4 is a cross-sectional view of the device of FIG. 1 illustrating the arrangement of the lines of equipotential when the surface of the intrinsic region is of the same conductivity type but of a lower carrier concentration than the remaining portion of the intrinsic region, or is slightly of an opposite conductivity than the remaining portion of the intrinsic region.

Another manner of controlling the curvature of lines 20 is by doping the intrinsic body 12 in the area of the entrant surfaces 22, which is designated as region 30 in FIG. 3. By doping region 30 more P type than the $\pi$ intrinsic body 12, the lines 20 are more curved, when reverse biased, as illustrated in FIG. 3, therefore, increasing the component of electrical force in the direction of region 16. Conversely, by doping regions 30 slightly N type or slightly less P type than the $\pi$ intrinsic body 12, when reverse biased, the lines 20 show less curvature as illustrated in FIG. 4, therefore, decreasing the component of electrical force in the direction of region 16.

For a $\nu$ intrinsic body 12, by doping region 30 more N type than the $\nu$ intrinsic body 12, the lines 20 are more curved when reverse biased as illustrated in FIG. 3, therefore, increasing the component of electrical force in the direction of region 16. By doping regions 30 slightly P type or slightly less N type than 84 intrinsic body 12, when reverse biased, the lines 20 show less curvature as illustrated in FIG. 4, therefore, decreasing the component of electrical force in the direction of region 16.

Thus, by regulating the curvature of lines 20 either by varying the bias or impurity doping on the intrinsic body 12, the spectral response of detector 10 to radiation incident upon it is controlled.

The present invention would find application as a flame detector, since most of the light emitted by flames is ultraviolet and the radiation detector 10 is capable of discriminating between ultraviolet and background light. Another application of the present invention would be as a fast laser monitor.

Figure 5:
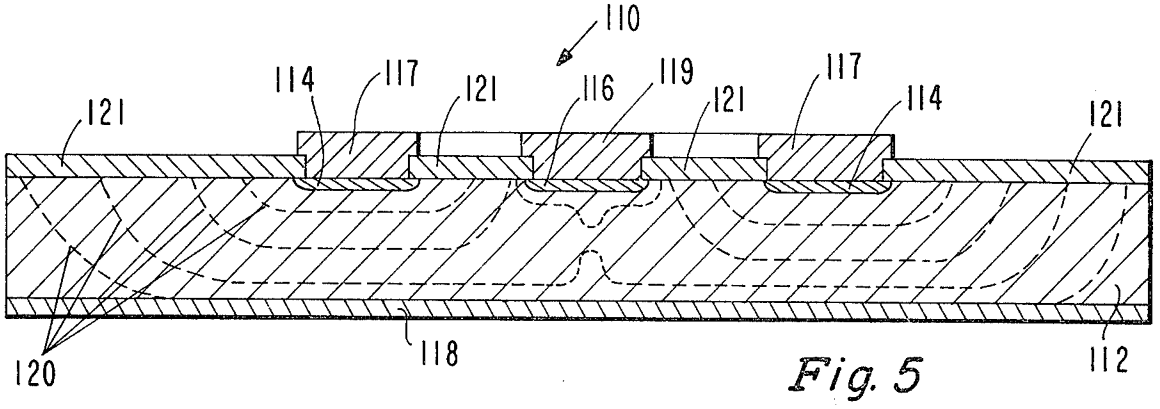
FIG. 5 is a cross-sectional view of a second embodiment of the radiation detector.
Figure 6:
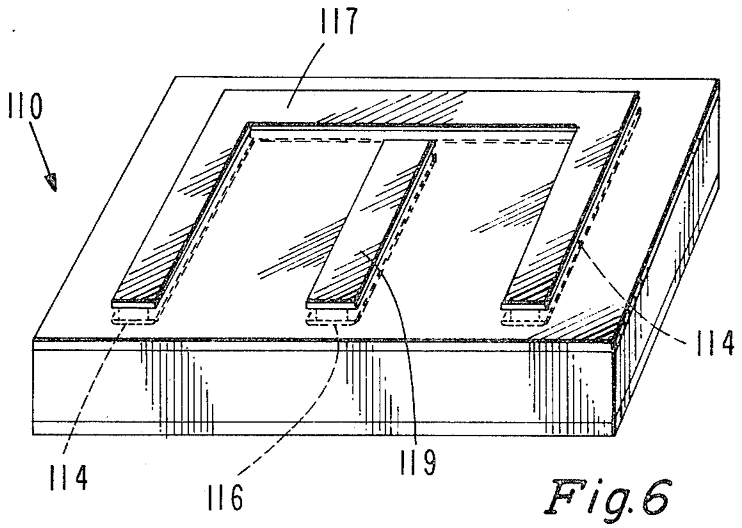
FIG. 6 is a perspective view of the second embodiment of the radiation detector showing the electrical contacts and conductivity regions.

A second embodiment of the present invention is designated as 110 in FIG. 5. The second embodiment of the present invention varies structurally, somewhat, from radiation detector 10. The semiconductor radiation detector 110 includes a body of intrinsic semiconductor material 112 and three conductivity regions, designated 114, 116 and 118. Regions 116 and 118 are the same as regions 16 and 18 of radiation detector 10, respectively. While the body of intrinsic semiconductor material 112 is the same as body 12 of radiation detector 10. However, region 114 differs from region 14 in that it partially or completely surrounds conductively region 116, as illustrated in FIG. 6.

When regions 116 and 118 are of a P type conductivity, then regions 114 are of N type conductivity and intrinsic semiconductor body 112 is of a $\pi$ type conductivity. Alternatively, if regions 116 and 118 are of an N type conductivity, then regions 114 are of a P type conductivity and intrinsic semiconductor body 112 is of a $\nu$ type conductivity.

Extenting over regions 114 is contact 117. Extending over region 116 is contact 119. The arrangements of contacts 117 and 119 is shown in FIG. 6. Contacts 117 and 119, like contacts 17 and 19, are of a highly reflective metallic material so that they will reflect light incident on them.

Radiation detector 110 also includes a layer 121 of thermally grown oxide, as does radiation detector 10.

The curvature of the electric field's lines of equipotential 120 is effected in the same manner as is the curvature of equipotential lines 20 in varying the reverse biasing voltage and impurity doping of intrinsic body 112.

Having region 114 completely or partially surrounding region 116 does have the effect of increasing the isolation resistance between regions 116 and 118. Since the load resistance on radiation detector 110 must be much smaller than the isolation resistance, having a small isolation resistance can place a restriction on the load resistance. Thus, region 114 surrounding region 116 reduces such a restriction on the load resistance.

I claim:

1. A radiation detector comprising a body of intrinsic semiconductor material having a pair of opposed surfaces, two spaced regions of opposite conductivity type in said body at one of said surface, a third region of either conductivity type at the other of said surfaces, and means for applying a reverse biasing voltage between the two spaced regions, and for biasing said third region with the same polarity as the spaced region having the same conductivity as said third region, whereby a depletion region is provided in the intrinsic body and the current output from the regions of the same conductivity type provide an indication of the wavelength of radiation falling on said body.

2. The radiation detector in accordance with claim 1 in which said intrinsic material is of a $\pi$ type conductivity, the regions of the same conductivity are of a P type conductivity and said other region is of an N type conductivity.

3. The radiation detector in accordance with claim 2 in which said one surface of said intrinsic body has a carrier concentration different from the remaining portion of said body.

4. The radiation detector in accordance with claim 3 in which said surface is more P type than the remaining portion of said body.

5. The radiation detector in accordance with claim 3 in which said surface is less P type than the remaining portion of said body.

6. The radiation detector in accordance with claim 3 in which said surface is slightly N type.

7. The radiation detector in accordance with claim 1 in which said intrinsic material is of a $\nu$ type conductivity, the regions of the same conductivity are of an N type conductivity and said other region is of a P type conductivity.

8. The radiation detector in accordance with claim 7 in which said one surface of said intrinsic body has a carrier concentration different from the remaining portion of said body.

9. The radiation detector in accordance with claim 8 in which said surface is less N type than the remaining portion of said body.

10. The radiation detector in accordance with claim 8 in which said surface is more N type than the remaining portion of said body.

11. The radiation detector in accordance with claim 8 in which said surface is slightly P type.

12. A radiation detector in accordance with claim 1 in which one of the two spaced conductivity regions at the one surface of the body at least partially surrounds the other of said two regions, and the conductivity type of said third region is the same as the conductivity type of the surrounded region.

13. The radiation detector in accordance with claim 1 wherein the third region is at the same potential as the spaced region having the same conductivity as said third region.

14. The radiation detector in accordance with claim 1 wherein the third region is at a different potential than the spaced region having the same conductivity as said third region.

* * * * *

UNITED STATES PATENT OFFICE
CERTIFICATE OF CORRECTION

PATENT NO. : 3,898,686

DATED : August 5, 1975

INVENTOR(S) : Jan Conradi

It is certified that error appears in the above-identified patent and that said Letters Patent are hereby corrected as shown below:

Column 3 line 59 after "than" delete "84" and insert -- ν --

Signed and Sealed this

*twenty-eight* Day of *October 1975*

[SEAL]

*Attest:*

RUTH C. MASON
*Attesting Officer*

C. MARSHALL DANN
*Commissioner of Patents and Trademarks*